United States Patent [19]

Hollstein et al.

[11] Patent Number: 5,291,075

[45] Date of Patent: Mar. 1, 1994

[54] FAULT DETECTION CIRCUIT

[75] Inventors: Roger L. Hollstein, Phoenix; Steven M. Domer; Frederic B. Shapiro, both of Mesa, all of Ariz.

[73] Assignee: Motorola, Inc., Schaumburg, Ill.

[21] Appl. No.: 590,997

[22] Filed: Oct. 1, 1990

[51] Int. Cl.$^5$ ................... H03K 19/02; H03K 5/153
[52] U.S. Cl. .................. 307/443; 307/455; 307/456; 307/473; 307/354; 307/362
[58] Field of Search ............ 307/443, 454–456, 307/473, 354, 362

[56] References Cited

U.S. PATENT DOCUMENTS

| | | | |
|---|---|---|---|
| 3,579,272 | 5/1971 | Foss | 307/455 |
| 3,906,212 | 9/1975 | Poguntke | 307/455 |
| 4,286,179 | 8/1981 | Konian | 307/455 |
| 4,745,304 | 5/1988 | Wilson | 307/455 |
| 4,871,929 | 10/1989 | Hollstein et al. | 307/362 |
| 4,980,579 | 12/1990 | McDonald et al. | 307/455 |

OTHER PUBLICATIONS

IBM Tech. Disc. Bul. vol. 27 No. 10A Mar. 1985 "Low Voltage Inverter Logic Tri-State Operation".

Primary Examiner—Margaret R. Wambach
Attorney, Agent, or Firm—Bradley J. Botsch, Sr.

[57] ABSTRACT

A circuit for detecting when a fault condition has occurred includes an input stage responsive to a logic signal supplied to an input of the circuit for providing an output logic signal at an output thereof. An output stage, including a pulldown circuit, responsive to the output logic signal of the input stage, for providing an output logic signal at an output of the circuit. A fault detection circuit coupled to the output of the input stage and to the output stage for forcing the output of the circuit to a predetermined logic state when the pulldown circuit of the output stage is defective.

10 Claims, 1 Drawing Sheet

FAULT DETECTION CIRCUIT

BACKGROUND OF THE INVENTION

This invention relates to detection circuits and, in particular, a fault detection circuit which senses pull down current from an ECL logic circuit thereby pulling an output of the ECL logic circuit to a known logic state when a fault has occurred.

Most, if not all, ECL circuits utilize a pull down circuit to provide the proper logic high and low voltage levels at an output. Further, ECL circuits are susceptible to a type of AC related failure that typically remains undetected under traditional stuck at fault coverage testing. An AC failure can occur when random process defect causes an open pull down circuit within the ECL circuit. Such defects can be related to contacts, vias, metal interconnect, resistor and transistor structures that have been isolated. For current state of the art VLSI ECL circuits, the probability of occurrence for this type of AC defect can reach 10,000 ppm. Therefore, if these defects are not detected, they can pose serious problems to the operation of any integrated circuit which includes the ECL circuit therein. However, if, for each time one of these defects occurred, the output of the ECL circuit was forced to a known logic state, the testability and reliability of the ECL circuit would substantially increase.

Hence, a need exists for a circuit that detects when an AC failure occurs in a logic circuit thereby forcing the output of the logic circuit to a known logic state.

SUMMARY OF THE INVENTION

Accordingly, it is an object of the present invention to provide an improved logic circuit.

Another object of the present invention is to provide an improved logic circuit for detecting when a failure occurs.

Yet another object of the present invention is to provide an improved logic circuit for forcing the output of a logic circuit to a known logic state in response to a failure.

In carrying out the above and other objects of the present invention there is provided a circuit having an input and an output comprising an input stage responsive to a logic signal supplied to the input of the circuit for providing an output logic signal at an output thereof; an output stage, responsive to the output logic signal of the input stage, for providing an output logic signal at the output of the circuit; and a detection circuit coupled both to the input stage and the output stage for forcing the output of the circuit to a predetermined logic state responsive to a fault condition occurring in the output stage.

The above and other objects, features and advantages of the present invention will be better understood from the following detailed description taken in conjunction with accompanying drawings.

DETAILED DESCRIPTION OF THE PRESENT INVENTION

Figure 1:
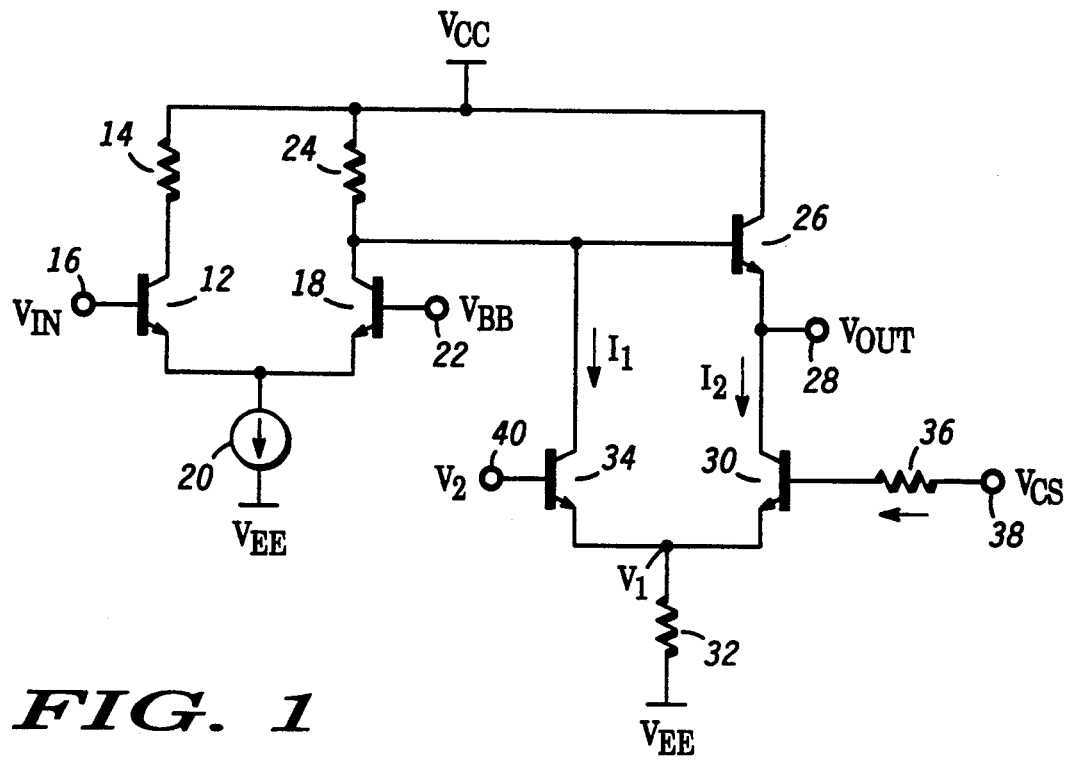
FIG. 1 is a detailed schematic diagram illustrating an ECL logic circuit incorporating a fault detection circuit in accordance with the present invention.

Referring to FIG. 1, a detailed schematic diagram illustrating an ECL logic circuit incorporating an AC fault detection circuit is shown comprising transistor 12 having a collector coupled by resistor 14 to a first supply voltage terminal at which the operating potential $V_{CC}$ is applied. The base of transistor 12 is coupled to terminal 16 at which voltage potential $V_{IN}$ is applied, while the emitter of transistor 12 is coupled to the emitter of transistor 18. Further, the emitters of transistors 12 and 18 are coupled by current source 20 to a second supply voltage terminal at which the operating potential $V_{EE}$ is applied. The base of transistor 18 is coupled to terminal 22 at which voltage potential $V_{BB}$ is applied, while the collector of transistor 22 is coupled by resistor 24 to operating potential $V_{CC}$. Transistor 26 has a collector coupled to operating potential $V_{CC}$, a base coupled to the collector of transistor 18, and an emitter coupled to output terminal 28 for providing voltage potential $V_{out}$. The emitter of transistor 26 is further coupled to the collector of transistor 30, the latter having an emitter coupled by resistor 32 to operating potential $V_{EE}$. The fault detection circuit of FIG. 1 is comprised to transistor 34 and resistor 36. Resistor 36 is coupled between the base of transistor 30 and terminal 38 where voltage potential $V_{CS}$ is applied. The collector of transistor 34 is coupled to the collector of transistor 18, while the base of transistor 34 is coupled to terminal 40 at which voltage potential $V_2$ is applied. Finally, the emitter of transmitter 34 is coupled to the emitter of transistor 30.

In operation, the input stage comprised of transistors 12 and 18, resistors 14 and 24 and current source 20 function in a well known manner to provide a voltage at the collector of transistor 18 which is a function of the voltage level appearing at terminal 16. The voltage at the collector of transistor 18 subsequentially provides output voltage $V_{out}$ at output terminal 28, via output transistor 26. To more clearly illustrate, assume that voltage $V_{IN}$ exceeds voltage $V_{BB}$ such that substantially all the current provided by current source 20 flows through transistor 12 and resistor 14, and substantially zero current flows through transistor 18 and resistor 24. Therefore, the voltage at the base of output transistor 26 is substantially equal to operating potential $V_{CC}$ and correspondingly the voltage $V_{out}$ is substantially equal to $V_{CC} - V_{be(tran.\ 26)}$. Or more succinctly, a logic high voltage level applied at the base of transistor 12 results in a logic high voltage level provided at the emitter of transistor 26 and output terminal 28.

On the other hand, assume that voltage $V_{BB}$ exceeds voltage $V_{IN}$ such that substantially all the current provided by current source 20 flows through transistor 18 and resistor 24, and substantially zero current flows through transistor 12 and resistor 14. Therefore, the voltage at the base of output transistor 26 is substantially equal to $V_{CC} - (I_{20} \times R_{24})$. Further, voltage $V_{out}$ can be calculated in equation 1;

$$V_{out} = V_{CC} - (I_{20} \times R_{24}) - V_{be(tran.\ 26)} \qquad (1)$$

where $V_{out}$ is the voltage at output terminal 28;
$I_{20}$ is the current provided by current source 20;
$R_{24}$ is the resistance of resistor 24; and
$V_{be(tran.\ 26)}$ is the base-emitter voltage of transistor 26.

More succinctly, a logic low voltage level applied at the base of transistor 12 results in a logic low voltage level provided at the emitter of transistor 26 and output terminal 28. The active pull down circuit comprised of transistor 30 and resistor 32 is necessary to bias transistor 26 with predetermined current $I_2$ and to achieve the proper output logic voltage levels at output terminal 28.

Under normal operation, the fault detection circuit comprised of transistor 34 and resistor 36 is transparent to the ECL logic circuit and provides virtually no increase in power and a negligible impact on size and performance. This is so because voltage $V_1$ will be sufficiently large enough to render transistor 34 non-operative during normal operation. Further, the voltage drop across resistor 36 is negligible since the base current of transistor 30 is typically small under proper operation.

However, if a fault condition occurs that causes abnormal operation of the active pull down circuit comprised of transistor 30 and resistor 32, transistor 34 will be rendered operative, current $I_1$ will flow through transistor 34, and output voltage $V_{out}$ will be forced to a known logic state. The fault condition could occur as a result of at least two types of defects as will described below. First assume a first type of defect is present which causes an open base, an open emitter or shorted base to emitter condition such that $I_{B(tran.\ 30)}$ or $I_{E(tran.\ 30)}$ substantially equals zero. This will allow transistor 34 to be rendered operative since transistor 30 is essentially rendered non-operative and voltage $V_2$ will be greater than voltage $V_1$. Transistor 34 will then function to draw a predetermined current ($I_1$) from operating potential $V_{CC}$ thereby pulling the base of transistor 26 to a predetermined voltage, via the voltage drop across resistor 24, such that a known logic state will be provided at output terminal 28, for example a logic low.

Secondly, assume a second type of defect is present which causes an open collector condition for transistor 30 where $I_{C(tran.\ 30)}$ substantially equals zero and, therefore, $I_{B(tran.\ 30)} = I_{E(tran.\ 30)}$. This condition may result from a break in the metal contact connecting the emitter of transistor 26 to the collector of transistor 30. For this condition, the base current of transistor 30 is typically beta times the normal operating base current of transistor 30. Therefore, the value of resistor 36 should be selected such that the voltage at the emitters of transistors 30 and 34 ($V_1$) will be sufficiently negative to forward bias transistor 34. Similar to the first type of defect, transistor 34 will then function to draw a predetermined current from operating potential $V_{CC}$ thereby pulling the base of transistor 26 to a predetermined voltage, via the voltage drop across resistor 24, such that a known logic state will be provided at output terminal 28, for example a logic low. It should be noted that the value of resistor 36 is chosen such that under normal operation, $I_{B(tran.\ 30)}$ causes a negligible voltage drop across resistor 36. However, for the second defect where $I_{B(tran.\ 30)} = I_{E(tran.\ 30)}$, the increased $I_{B(tran.\ 30)}$ causes a sufficient voltage drop across resistor 36 to make the voltage at the emitter of transistor 30 ($V_1$) such that the differential voltage ($V_2 - V_1$) is greater than the base emitter turn on voltage of transistor 34 in order to render transistor 34 operative.

Figure 2:
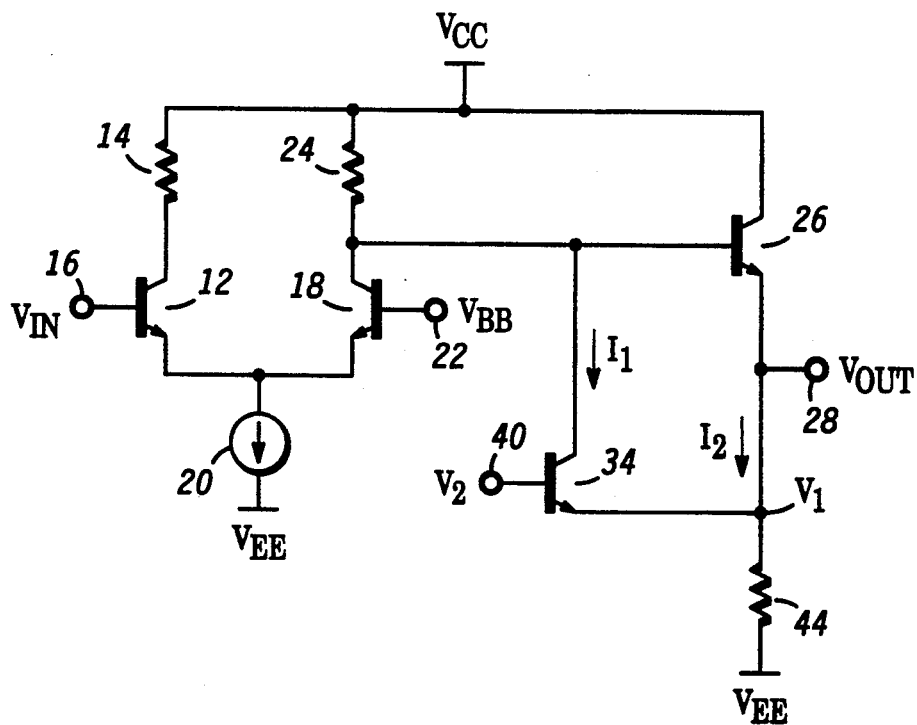
FIG. 2 is a detailed schematic diagram illustrating an ECL logic circuit incorporating an alternate embodiment of a fault detection circuit in accordance with the present invention.

Referring to FIG. 2, a detailed schematic diagram illustrating an ECL logic circuit incorporating an alternate embodiment of a fault detection circuit is shown. It is understood that components similar to those of FIG. 1 are indicated by the same reference numbers. The circuit of FIG. 2 further comprises a passive pull down circuit comprised to resistor 44 which is coupled between the emitters of transistors 26 and 34 and operating potential $V_{EE}$. Also, the fault detection circuit of FIG. 2 comprises transistor 34 whereby the fault detection circuit of FIG. 1 comprises transistor 34 and resistor 36.

In operation, voltage $V_2$ is selected to insure that transistor 34 is rendered non-operative during normal operation. Therefore, the current through transistor 26 and resistor 44 will provide a sufficient voltage drop across resistor 44 such that the differential voltage ($V_2 - V_1$) is less than the base emitter turn on voltage of transistor 34 in order to render transistor 34 non-operative. However, if an open circuit condition exists between the emitter of transistor 26 and resistor 44, voltage $V_2$ is also selected to allow transistor 34 to become operative. Therefore, the differential voltage ($V_2 - V_1$) will be greater than the base emitter turn on voltage of transistor 34 in order to render transistor 34 operative. Further, as aforedescribed, transistor 34 will then function to draw a predetermined current ($I_1$) from operating potential $V_{CC}$ thereby pulling the base of transistor 26 to a predetermined voltage, via the voltage drop across resistor 24, such that a known logic state will be provided at output terminal 28, for example a logic low.

By now it should be apparent from the foregoing discussion that a novel fault detection circuit has been provided for forcing the output of a logic circuit to a known logic state when a fault condition occurs.

We claim:

1. A circuit having an input and an output, comprising:
    an input stage responsive to a logic signal supplied to the input of the circuit for providing an output logic signal at an output thereof;
    an output stage, responsive to said output logic signal of said input stage, for providing an output logic signal at the output of the circuit;
    a pulldown circuit coupled to said output stage for providing proper voltage logic levels at the output of the circuit; and
    detection means coupled to said output of said input stage and to said pull down circuit for forcing the output of the circuit to a predetermined logic state responsive to a fault condition occurring in said pull down circuit.

2. The circuit according to claim 1 wherein said detection means includes:
    a transistor having a collector, a base and an emitter, said collector being coupled to said output of said input stage, said base being coupled to a first terminal at which a first reference potential is applied, and said emitter being coupled to a first supply voltage terminal; and
    a resistor coupled between said pull down circuit and a second terminal at which a second reference voltage is applied.

3. The circuit according to claim 2 wherein said output stage includes:
    a transistor having a collector, a base and an emitter, said collector being coupled to a second supply voltage terminal, said base being coupled to said output of said input stage, and said emitter being coupled to the output of the circuit;

4. The circuit according to claim 3 wherein said pull down circuit includes:
    a transistor having a collector, a base and an emitter, said collector being coupled to said emitter of said transistor of said output stage, said base being coupled to said second terminal by said resistor of said detection means, and said emitter being coupled to said first supply voltage terminal and to said emitter of said transistor of said detection means; and a resistor coupled between said emitter of said transistor of said output stage and said first supply voltage terminal.

5. The circuit according to claim 4 wherein said input stage includes:
- a first transistor having a collector, a base and an emitter, said collector being coupled to said second supply voltage terminal, said base being coupled to the input of the circuit;
- a second transistor having a collector, a base and an emitter, said collector being coupled to second supply voltage terminal and to said output of said input stage, said base being coupled to a third terminal at which a bias voltage is supplied, and sid emitter being coupled to said emitter of said first transistor of said input stage;
- a first resistor coupled between said collector of said first transistor of said input stage and said second supply voltage terminal;
- a second resistor coupled between said collector of said second transistor of said input stage and said second supply voltage terminal; and
- a current source coupled between said emitters of said first and second transistors of said input stage and said first supply voltage terminal.

6. The circuit according to claim 1 wherein said detection means includes a transistor having a collector, a base and an emitter, said collector being coupled to said output of said input stage, said base being coupled to a first terminal at which a first reference potential is applied, and said emitter being coupled to a first supply voltage terminal.

7. The circuit according to claim 6 wherein said output stage includes a transistor having a collector, a base and an emitter, said collector being coupled to a second supply voltage terminal, said base being coupled to said output of said input stage, and said emitter being coupled to the output of the circuit and to said emitter of said transistor of said detection means.

8. The circuit according to claim 7 wherein said pulldown circuit includes a resistor coupled between said emitter of said transistor of said output stage and said first supply voltage terminal.

9. The circuit according to claim 8 wherein said input stage includes:
- a first transistor having a collector, a base and an emitter, said collector being coupled to said second supply voltage terminal, said base being coupled to the input of the circuit;
- a second transistor having a collector, a base and an emitter, said collector being coupled to second supply voltage terminal and to said output of said input stage, said base being coupled to a third terminal at which a bias voltage is supplied, and said emitter being coupled to said emitter of said first transistor of said input stage;
- a first resistor coupled between said collector of said first transistor of said input stage and said second supply voltage terminal;
- a second resistor coupled between said collector of said second transistor of said input stage and said second supply voltage terminal; and
- a current source coupled between said emitters of said first and second transistors of said input stage and said first supply voltage terminal.

10. A method of detecting when a fault condition occurs in a pulldown stage of a circuit, comprising the steps of:
- monitoring a voltage at a node of the pulldown stage;
- forward biasing a first transistor when said voltage at said node reaches a predetermined threshold; and
- forcing an output of the circuit to a predetermined logic state, said predetermined logic state being indicative of a fault condition occurring in the pulldown stage.

* * * * *

UNITED STATES PATENT AND TRADEMARK OFFICE
CERTIFICATE OF CORRECTION

PATENT NO. : 5,291,075
DATED : March 1, 1994
INVENTOR(S) : Roger L. Hollstein et al.

It is certified that error appears in the above-indentified patent and that said Letters Patent is hereby corrected as shown below:

Column 5, line 19, delete "sid" and insert therefor --said--.

Signed and Sealed this

Eighth Day of August, 1995

Attest:

BRUCE LEHMAN

Attesting Officer

Commissioner of Patents and Trademarks